United States Patent
Takamiya et al.

[11] Patent Number: 6,143,418
[45] Date of Patent: Nov. 7, 2000

[54] TRANSPARENT CONDUCTIVE FILM, LOW-REFLECTIVITY TRANSPARENT CONDUCTIVE FILM, AND DISPLAY DEVICE

[75] Inventors: Naoki Takamiya, Inba-gun; Yasunori Kunimitsu, Matsudo; Kenji Adachi, Funabashi; Kazutomo Mori, Ichikawa; Ichirou Noda, Narashino; Atsumi Wakabayashi, Ichikawa, all of Japan

[73] Assignee: Sumitomo Osaka Cement Co., Ltd., Tokyo, Japan

[21] Appl. No.: 09/011,417

[22] PCT Filed: Jun. 2, 1997

[86] PCT No.: PCT/JP97/01866

§ 371 Date: Feb. 6, 1998

§ 102(e) Date: Feb. 6, 1998

[87] PCT Pub. No.: WO97/48107

PCT Pub. Date: Dec. 18, 1997

[30] Foreign Application Priority Data

Jun. 11, 1996 [JP] Japan .................................... 8-149505
Mar. 6, 1997 [JP] Japan .................................... 9-052053

[51] Int. Cl.$^7$ ............................ B32B 15/04; C09D 5/24; H01J 29/28
[52] U.S. Cl. ........................... 428/434; 428/469; 428/922
[58] Field of Search ................... 428/626, 630, 428/673, 670, 631, 433, 434, 457, 469, 922; 313/370

[56] References Cited

U.S. PATENT DOCUMENTS 4,565,719  1/1986  Phillips et al. ............................ 428/34
5,493,102  2/1996  Takase et al. ............................ 219/547
5,785,897  7/1998  Toufuku et al. ......................... 252/514
5,911,899  6/1999  Yoshikai et al. ........................ 219/522

FOREIGN PATENT DOCUMENTS

| | | |
|---|---|---|
| 35-6616 | 9/1932 | Japan . |
| 55-51737 | 4/1980 | Japan . |
| 57-36714 | 2/1982 | Japan . |
| 57-85866 | 5/1982 | Japan . |
| 58-82407 | 5/1983 | Japan . |
| 58-91777 | 5/1983 | Japan . |
| 60-220507 | 11/1985 | Japan . |
| 62-278705 | 12/1987 | Japan . |
| 63-64012 | 12/1988 | Japan . |
| 1-320742 | 12/1989 | Japan . |
| 3-11532 | 1/1991 | Japan . |
| 3-254048 | 11/1991 | Japan . |
| 4-23484 | 1/1992 | Japan . |
| 4-196009 | 7/1992 | Japan . |
| 5-203804 | 8/1993 | Japan . |
| 6-80903 | 3/1994 | Japan . |
| 52-1497 | 6/1995 | Japan . |
| 7-151903 | 6/1995 | Japan . |

*Primary Examiner*—John J. Zimmerman
*Attorney, Agent, or Firm*—Pitney, Hardin, Kipp & Szuch, LLP

[57] ABSTRACT

A transparent conductive film having a transparent conductive layer containing at least two types of metals wherein the film is high in transparency, tonability, and conductivity, and provides for static prevention and electromagnetic shielding effects, enables adjustment of the tone of transmitted images, and has durability with respect to saline resistance, acid resistance, oxidation resistance, and ultraviolet resistance.

9 Claims, 1 Drawing Sheet

TRANSPARENT CONDUCTIVE FILM, LOW-REFLECTIVITY TRANSPARENT CONDUCTIVE FILM, AND DISPLAY DEVICE

TECHNICAL FIELD

The present invention relates to a transparent conductive film having high transparency, tonability, and conductivity, exceptional anti-static effects and electromagnetic shielding effects, and greatly improved durability such as with respect to saline resistance, acid resistance, oxidation resistance, and ultraviolet resistance; a low-reflectivity transparent conductive film having exceptional anti-reflective effects in addition to the above-mentioned properties; and an electromagnetically shielded display device having this low-reflectivity transparent conductive film formed on the display screen.

BACKGROUND ART

Conventionally, transparent materials having high dielectric constants such as glasses and plastics tend to accumulate static electricity and allow transmission of electromagnetic waves. In particular, in cathode ray tubes and plasma displays which are often used for TV Braun tubes and computer displays, dust can collect due to static electricity generated on the display screen so as to lower the visibility, and electromagnetic waves can be radiated to affect the environs. For this reason, transparent conductive films have been affixed to the display screens of cathode ray tubes and plasma displays used in TV Braun tubes and computer displays for the purposes of preventing static electricity and/or shielding electromagnetic waves.

Conventional transparent conductive films are produced by forming a transparent conductive oxide such as indium oxide on a display screen by means of sputtering or vapor deposition and affixing this to the display screen of a display device, or by coating the front surface of a display screen with a dispersion fluid of antimony-doped tin oxide and a silica sol binder. Additionally, there are transparent conductive films which are provided with a reflection preventing function by making use of interference effects which occur due to reflection at a plurality of thin film surfaces, by laminating the top layer and/or the bottom layer of the transparent conductive film with at least one transparent anti-reflective layer having a refractive index different from the transparent conductive layer.

As conventional methods for forming a transparent conductive film which not only prevents the accumulation of static electricity but also has conductivity high enough to shield electromagnetic radiation on the display screen of a display device, a process of putting the display screen into a vapor deposition oven and depositing indium oxide compounds or tin oxide compounds thereon (PVD process), and a process of forming a transparent conductive film on the display screen by thermal decomposition of organic compounds such as indium or tin, or saline solution (CVD process) are known.

While the transparent conductive films formed by the above-mentioned methods are sufficiently transparent when used only as anti-static films in which case the film thickness can be small, when used as electromagnetic wave shielding layers or electrode films, they must be made somewhat thicker because they require high conductivity, as a result of which the transparency can be reduced, and the screen darkened, as well as giving rise to problems such as absorption of specific optical wavelengths which can cause coloring of the conductive film and cause unnatural changes in the hue of the transmitted images. Additionally, since a vacuum or high temperatures are required in order to form a film using the above-mentioned PVD process or CVD process, the cost of investments in order to form a transparent conductive film on a large-area substrate can become extremely high, the efficiency can be degraded, and the production costs can inflate.

Coating processes have been proposed for efficiently forming transparent conductive films on large substrates while suppressing equipment investments. For example, coating materials containing organic indium compounds is disclosed in Japanese Patent Application, First Publication No. Sho 52-1497, and coating materials having indium salts or tin salts dissolved in water or organic solvents are disclosed in Japanese Patent Application, First Publication No. Sho 63-6401, Japanese Patent Application, First Publication No. Sho 55-51737, Japanese Patent Application, First Publication No. Sho 58-82407, Japanese Patent Application, First Publication No. Sho 57-36714, and Japanese Patent Application, First Publication No. Sho 60-22507. However, since the formation of transparent conductive films using these coating materials requires heat treatment at high temperatures of at least 350° C. after coating the substrate, there are limitations to the materials which can be used for the substrate, and there are many restrictions with regard to the production steps.

Coating materials wherein microparticles or colloids of transparent conductive oxides such as tin oxide and indium oxide are dispersed in polymer solutions or binder resins are disclosed in Japanese Patent Application, Second Publication No. Sho 35-6616, Japanese Patent Application, First Publication No. Sho 57-85866, Japanese Patent Application, First Publication No. Sho 58-91777, and Japanese Patent Application, First Publication No. Sho 62-278705. These coating materials are held to be capable of forming transparent conductive films at relatively low temperatures.

However, all of the above-mentioned transparent conductive films require the thickness of the coating film to be made small in order to obtain a practical level of transparency; making them thin causes the conductivity to be reduced, so that although they are useful for the purposes of static prevention, they are insufficient for the purposes of electrical shielding; making them thick causes the transparency to be reduced, which darkens the screen and limits the possibilities of use.

As a transparent conductive film having exceptional electromagnetic shielding effects and anti-reflection effects, Japanese Patent Application, First Publication No. Hei 8-77832 disclosed one comprising a transparent conductive layer composed of metallic microparticles having an average grain size of 2–20 nm and a transparent coat having a lower refractive index. Although electromagnetic shielding effects can be expected of this transparent conductive film, it fails to provide a solution to the problem of absorption occurring at specific wavelengths of transmitted light depending on the light transmission spectrum of the metal, thereby coloring the conductive film and unnaturally changing the hue of the transmitted image, and it also cannot be expected to provide sufficient anti-reflective effects.

Aside from the above, if the purpose is simply to form a conductive film, Japanese Patent Application, First Publication No. Hei 4-23484 discloses a process of coating with a coating material wherein reduced metallic colloid particles are dispersed in a photosensitive resin, and Japanese Patent Application, First Publication No. Hei 4-196009 discloses a process of printing a conductive paste onto a dielectric green sheet using a screen printing method, but these are both non-transparent and do not result in a transparent conductive film.

The present invention has been made to resolve the above problems, and therefore its object is to offer a transparent conductive film having high transparency, tonability, and conductivity, exceptional anti-static effects and electromagnetic shielding effects, adjusted tone of the transmitted images, and greatly improved durability such as with respect to saline resistance, acid resistance, oxidation resistance, and ultraviolet resistance; a low-reflectivity transparent conductive film having exceptional anti-reflective effects in addition to the above-mentioned properties; and an electromagnetically shielded display device having this low-reflectivity transparent conductive film formed on the display screen.

DISCLOSURE OF THE INVENTION

The present inventors achieved the present invention as a result of diligent research for resolving the above-mentioned problems by discovering that a transparent conductive film having a transparent conductive layer containing at least two types of metals in an amount of at least 10% by weight is capable of being produced at a relatively low cost, has high transparency, tonability, and conductivity, exceptional anti-static effects and electromagnetic shielding effects, enables adjustment of the tone of the transmitted images and has greatly improved durability such as with respect to saline resistance, acid resistance, oxidation resistance, and ultraviolet resistance.

Thus, the present invention offers a transparent conductive film, comprising a transparent conductive layer containing at least two types of metals in a total amount of at least 10% by weight.

In the above, the at least two types of metal sin the transparent conductive layer should preferably be selected from the group consisting of silver, gold, copper, platinum, palladium, ruthenium, rhodium, iridium, osmium, rhenium, and nickel.

In the above, one of the at least two types of metals in the transparent conductive layer should preferably be silver.

In the above, one of the at least two type of metals in the transparent conductive layer should preferably be palladium.

In the above, the transparent conductive layer should preferably contain palladium and silver, in a ratio Pd:Ag within the range of 30–99% by weight:70–1% by weight.

In the above, at least a portion of the metals in the transparent conductive layer should preferably be fused to form a continuous metallic thin film.

In the above, at least a portion of the at least two types of metals in the transparent conductive layer should preferably form an alloy.

In the above, the transparent conductive layer should preferably be formed by applying to a base material a transparent-conductive-film-forming coating material containing at least two types of metallic microparticles having an average grain size of 100 nm or less, then baking at a temperature within the range of 130–250° C. This transparent-conductive-film-forming coating material should preferably contain alcohol in an amount of at least 45% by weight.

The present invention also offers a low-reflectivity transparent conductive film comprising a transparent conductive film as described above, and at least one transparent thin film provided above and/or below the transparent conductive film, having a refractive index different from the refractive index of the transparent conductive layer.

In the above, the transparent thin film should preferably contain $SiO_2$.

In the above, a transparent rough layer should preferably be formed as an outermost layer of the low-reflectivity transparent conductive film.

In the above, at least one layer constituting the low-reflectivity transparent conductive film should preferably contain a colorant.

The present invention also offers a display device having a low-reflectivity transparent conductive film in accordance with any one of claims 10–13 formed on a display screen.

BEST MODE FOR CARRYING OUT THE INVENTION

Figure 1:
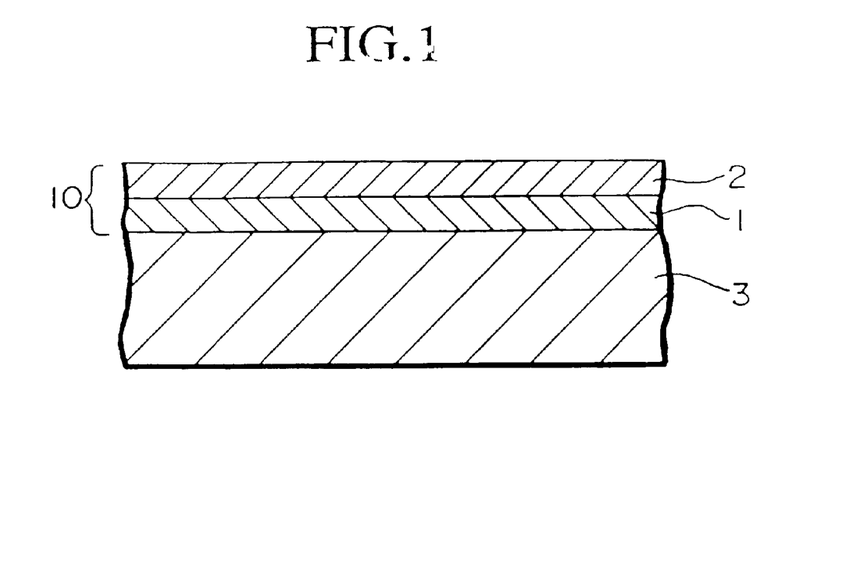
FIG. 1 is a section view showing a preferred low-reflectivity transparent conductive film and display device according to the present invention.

An example of the best mode for carrying out the present invention shall be explained with reference to the attached FIG. 1. In FIG. 1, this low-reflectivity transparent conductive film 10 is formed on the front surface of the display screen 3 of a display device and is formed by sequentially laminating a transparent conductive film 1 and a transparent thin film 2 having a refractive index different from this transparent conductive film 1 onto the display screen 3.

This transparent conductive layer 1 contains palladium and silver in a total amount of at least 10% by weight. The proportions of palladium and silver in the mixture, expressed as a ratio of Pd:Ag, should preferably be within the range of 30–99% by weight:70–1% by weight. Although the palladium and silver may be contained in the transparent conductive layer 1 as respectively independent microparticles, at least a portion of them should preferably be fused to form a metallic thin film which is continuous, and at least one portion thereof forms an alloy composed of palladium and silver.

When palladium and silver are present in the form of microparticles in this transparent conductive layer 1, the microparticles are in mutual contact, and at least a portion thereof is fused to form a continuous alloy thin film. Therefore, not only is the conductivity high as a result of which the static prevention effects and electromagnetic shielding effects are exceptional, but the transparency is also high, and since a portion of the metal is palladium, the conductivity is not lost even in a metal-corroding environment such as in saline water or sunlight, and exceptional durability is obtained such as with respect to saline resistance, acid resistance, oxidation resistance, and ultraviolet resistance. Additionally, since a portion of the metal is silver, sufficient conductivity can be ensured while enabling production at a reduced cost in comparison to use of only palladium.

This transparent conductive layer 1 contains palladium microparticles and silver microparticles having an average grain size of preferably 20 nm or less, and is preferably formed by coating the display screen 3 with a coating containing at least 45% by weight of alcohol by using a spin coater, then baking at a temperature of preferably 150–250° C. The present inventors discovered that since the average grain sizes of the metallic microparticles contained in this coating are 20 nm or less, the microparticles will fuse even if the baking temperature is as low as 150–250° C., so that an alloy thin film is at least partially formed. Additionally, the alcohol in this coating lowers the viscosity and surface tension of coatings containing metallic microparticles, thereby forming a coating film having a uniform thickness, and is also particularly effective in preventing the metallic microparticles from forming secondary particles.

The preferred low-reflectivity transparent conductive film 10 of the present invention shown in FIG. 1 has a single layer of a transparent thin film 2 having a refractive index different from the refractive index of the transparent conductive layer 1 formed on top of the transparent conductive layer 1. This transparent thin film 2 is formed from $SiO_2$ or the like which has a relative low refractive index. The presence of this transparent thin film 2 above the transparent conductive layer 1 effectively prevents reflection of ambient light from the low-reflectivity transparent conductive film 10, and contributes reflection prevention in addition to the above-mentioned transparency, static prevention, electromagnetic shielding, and durability.

In a more preferable low-reflectivity transparent conductive film according to the present invention, a transparent rough layer is formed as the outermost layer. This transparent rough layer is preferably composed of a transparent film having a low refractive index, and has a surface with a rough profile so as to scatter light reflected from the surface of the low-reflectivity transparent conductive film and give the display screen an anti-glare effect.

In a more preferable low-reflectivity transparent conductive film according to the present invention, at least one of the transparent conductive layer 1 or the transparent thin film 2 contains a colorant. This colorant absorbs light in a specific wavelength band within the range of 400–800 nm which is the wavelength band of visible light according to the type of metal contained in the transparent conductive layer, and is added for the purposes of improving the contrast of the transmitted images and/or for the purposes of adjusting the hue when the transmitted images appear to have an unnatural color, as a result of which it is possible to obtain a low-reflectivity transparent conductive film with improved perceptibility.

The preferred display device of the present invention has the above-described low-reflectivity transparent conductive film 10 formed on the front surface of the display screen 3 as shown in FIG. 1, due to which the display device of the present invention is such that static electricity is prevented so as to prevent the accumulation of dust or the like, electromagnetic waves are effectively shielded to prevented various types of electromagnetic disturbances, the screen has high transparency so that the transmitted images are bright, the reflection of ambient light is effectively prevented so that the perceptibility is high, and the transmitted images are clear, and the hue is adjusted so that the transmitted images have colors which appear natural. Furthermore, degradation of the properties is prevented over long periods of time under severe environmental conditions.

Next, each component of the present invention shall be explained in detail.

The transparent conductive film of the present invention essentially has a transparent conductive layer containing at least two types of metals in a total of at least 10% by weight.

Examples of metals which can be suitably used for the above are those having good conductivity and relatively low susceptibility to corrosion, for example, silver, gold, cooper, platinum, palladium, ruthenium, rhodium, iridium, osmium, rhenium, and nickel. While at least two types of these metals can be combined arbitrarily, those having high transparency and low absorption at specific wavelengths so as to give the transmitted images a natural hue, and with good conductivity should preferably be selected.

In the above-mentioned transparent conductive film, at least one of the two types of metals should preferably be silver. The reason for this is that silver can be obtained relatively easily and economically in the form of a colloidal dispersion fluid, has high conductivity and exceptional static prevention and electromagnetic shielding effects, and forms a highly transparent conductive layer.

Palladium should preferably be used as a metal in combination with silver. The reason for this is that palladium has high conductivity and is chemically stable, is highly resistant to chloride, sulfide, and oxide atmospheres, and will not change the hue of transmitted light because it has no absorption in specific wavelength bands in the range of 400–800 nm which is the wavelength band of visible light, so as not to degrade the visibility of transmitted images.

While silver is a metal having relatively low durability with respect to saline resistance, acid resistance, and the like, using silver in combination with palladium allows for the formation of a transparent conductive film with exceptional durability with respect to saline resistance, acid resistance, and the like because palladium and silver sill fuse to form a Pd—Ag alloy even at relatively low baking temperatures of 150–250° C. when the transparent conductive layer is formed.

When palladium and silver are used together, the proportional content should preferably be such that the ratio Pd:Ag is within the range of 30–99% by weight:70–1% by weight. If the proportional content of palladium is higher, the durability of the transparent conductive film with respect to saline resistance, acid resistance, and the like will increase.

When silver is used in at least a portion of the metals in the transparent conductive layer, gold is another example of a metal which may be used therewith. While silver has a characteristic absorption in the shorter wavelengths of the visible light range and as a result has a tendency to apply a rather yellowish color to the transmitted images, blending in a relatively small amount of gold causes the transmitted spectrum to become flattened in the visible light range, thereby correcting the deviation in the hue of the transmitted images.

The reason the content of the metals in the transparent conductive layer is made at least 10% by weight is that the conductivity is reduced if the content is less than 10% by weight, and it becomes difficult to obtain a substantial electromagnetic shielding effect.

The metals in the transparent conductive layer may be present in the form of respectively independent microparticles, may be fused in at least one portion to form a continuous metallic thin film, may have at least two types of metals fused in at least one portion to form an alloy so as to result in an alloy thin film, or may have microparticles and an alloy thin film in a state of mixture.

The transparent conductive layer can be formed by coating a base material with a transparent-conductive-layer-forming coating material containing at least two types of metallic microparticles having an average grain size of 100 nm or less, then baking at a temperature of 150–250° C. When the average grain size of the metallic microparticles is 100 nm or less, then fusion and alloying of the particles is promoted even at relatively low baking temperatures of 150–250° C., so as to form a transparent conductive film having both excellent conductivity and transparency. In view of the fusion and alloying of the metallic microparticles, the average grain size of the metallic microparticles should particularly be 20 nm or less.

On the other hand, if the average grain size of the metallic microparticles in the transparent-conductive-layer-forming coating material exceeds 100 nm, then the absorption of light by the coating film becomes too high to obtain a transparent conductive film having a practical level of transparency.

The above-described transparent-conductive-layer-forming coating material should preferably contain at least two types of metallic microparticles and contain alcohol in an amount of at least 45% by weight. The alcohol lowers the viscosity and surface tension of the coating material containing the metallic microparticles so as to form a coating film of uniform thickness, and is particularly effective in preventing secondary granulation of the metallic microparticles. This effect is not fully activated if the content of the alcohol is less than 45% by weight.

While there are no particular restrictions as to the type of alcohol which may be used in the transparent-conductive-layer-forming coating material, lower alcohols, higher alcohols, and glycols may be used. Particularly in view of lowering the viscosity and surface tension of the coating material, it is preferable to use lower alcohols having 1–4 carbon atoms; for example, methyl alcohol, ethyl alcohol, n-propyl alcohol, isopropyl alcohol, n-butyl alcohol, sec-butyl alcohol, tert-butyl alcohol, or a mixture of two or more of these.

Aside from the at least two types of metallic microparticles and the alcohol, the above-described transparent-conductive-layer-forming coating material may also contain inorganic microparticles comprising oxides, composite oxides, or nitrides of silicon, aluminum, zirconium, cerium, titanium, yttrium, zinc, magnesium, indium, tin, antimony, or potassium, especially oxides, composite oxides, or nitrides of indium as principal components, for the purposes of further increasing the transparency of the transparent conductive film. The average grain size of these inorganic microparticles should preferably be 100 nm or less, and more preferably 50 nm or less, for the same reasons as mentioned above.

The above-mentioned transparent-conductive-layer-forming coating material may also contain binder components for increasing the film strength of the transparent conductive film. Examples of binder components which may be used include organic synthetic resins such as polyester resins, acrylic resins, epoxy resins, melamine resins, urethane resins, butyral resins, and ultraviolet-hardening resins, hydrolysates of alkoxides of metals such as silicon, titanium, and zirconium, and organic/inorganic binder components such as silicone monomers and silicone oligomers.

In particular, it is preferable to use as binders compounds expressed by the following formula:

$$M(OR)_m R_n$$

(wherein M represents Si, Ti, or Zr, R represents a $C_1$–$C_4$ alkyl group, m represents an integer of 1–4, n represents an integer of 0–3, and m+n equals 4), partial hydrolysates thereof, or mixtures of more types thereof.

The binder component should preferably be added in an amount of 10% by weight or less because it can cause the conductivity of the transparent conductive film to be reduced if added in an excessive amount.

In order to increase the affinity between the binder component and the metallic microparticles, the surfaces of the metallic microparticles may be treated with coupling agents such as silicone coupling agents and titanate coupling agents, or with lipophilic surface-treating agents such as carboxylic acid salts, polycarboxylic acid salts, phosphoric ester salts, sulfonic acid salts, or polysulfonic acid salts.

Furthermore, the transparent-conductive-layer-forming coating material may contain various types of surfactants and/or be pH-adjusted in order to maintain the dispersion stability of the metallic microparticles in the coating material if required. Examples of surfactants which can be used for this purpose include anionic surfactants such as polycarboxylic acid salt types, sulfonic acid salt types, and phosphoric ester types, macromolecular surfactants such as polyvinyl alcohols, polyvinyl pyrrolidone, polyethylene glycol, and cellulose, and cationic surfactants such as amine salt types. Additionally, the pH may be adjusted by adding inorganic acids, inorganic bases, or organic bases. Furthermore, aside from the above-mentioned dispersion stabilizers, it is possible to add silicone type surfactants or fluorine type surfactants in order to adjust the leakage and sealability with respect to display screen base materials such as glass or plastics.

The method for producing the transparent-conductive-layer-forming coating material is not particularly restricted. For example, it may be produced by mixing a colloid solution containing at least two types of metallic microparticles with the above-described alcohols, inorganic microparticles, and binders as needed, and uniformly blending by conventionally used dispersion techniques such as by using an ultrasonic mixer or a sand mill.

As an example, the transparent conductive layer can be formed by the following methods. One method involves separately preparing colloidal dispersion fluids which each contain a single type of metallic microparticle having an average grain size of 100 nm or less, for example a silver sol and a palladium sol, then mixing these together in a designated proportion and adding the above-mentioned alcohols, transparent inorganic microparticles and/or binders as needed in order to prepare a transparent-conductive-layer-forming coating material containing at least two types of metallic microparticles, uniformly coating a base material of a display screen with this coating material such that the content of the metals in the transparent conductive layer after drying will become at least 10% by weight, drying, and baking for one hour at a constant temperature in the range of 150–250° C.

Another method for forming the transparent conductive layer involves separately preparing colloidal dispersion fluids such as a silver sol and a palladium sol which each contain a single type of metallic microparticle having an average grain size of 100 nm or less and the above-mentioned alcohols, transparent inorganic microparticles and/or binders as needed, uniformly coating a base material with these coating materials in order such that the proportions of the metals in the transparent conductive layer after drying will become a designated value, drying, and baking. There are no particular restrictions for the order of coating in this method.

The transparent conductive film of the present invention can be formed by coating a base material of a display screen or the like with the above-described transparent-conductive-layer-forming coating material, and baking to form a film. The coating can be performed using any commonly known thin film coating technique, such as spin coating, roll coating, knife coating, bar coating, spray coating, meniscus coating, dip coating, or gravure printing. Of these, spin coating is an especially preferable coating method because it enables the formation of a thin film having a uniform thickness in a short period of time.

After coating, the coating film is dried, then baked at 150–250° C. to form a transparent conductive layer on the surface of the base material. The resulting transparent conductive layer may form a smooth coat, or may have a lamina structure having irregularities, a mesh structure, or a plumose structure.

It was discovered that due to the extremely small particle size of the metallic microparticles in the transparent-conductive-layer-forming coating material, when forming a coating film, at least a portion fuses to form a continuous metallic thin film even at surprisingly low baking temperatures of 150–250° C. at which normal coarse particles do not fuse. This is clear from observations made by microscopes. Additionally, for example, when a coating film containing palladium microparticles and silver microparticles having an average grain size of 20 nm or less was baked at 175° C., the surface resistively of the thin film was as low as 100–1000 Ω/square, thus indicating a reduction in the intergranular resistance. Since this effect is particularly evident when silver particles which have a relatively low melting point are present, the surface resistivity of the thin film can be greatly improved in comparison to the case of using only palladium microparticles even if the amount of silver particles is on the order of only a few % by weight.

Figure 2:
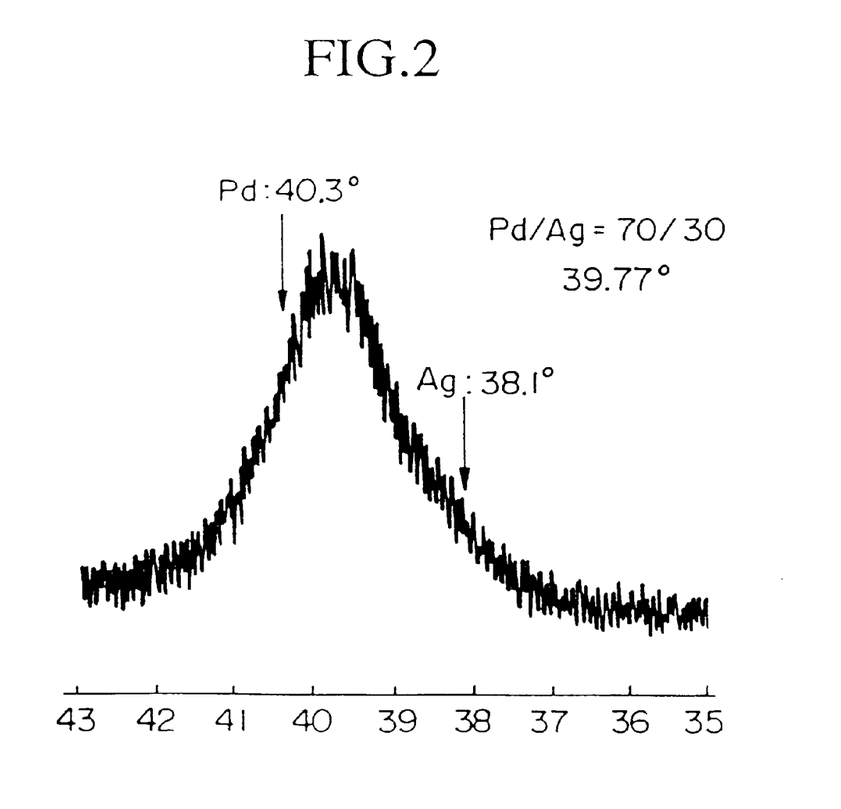
FIG. 2 is an X-ray diffraction diagram for a preferred embodiment of the present invention.

Additionally, it was discovered that an alloy is produced in a metallic thin film wherein at least two types of metallic microparticles are fused. This is clear from X-ray diffraction of a sample formed by baking a coating film containing palladium microparticles and silver microparticles at 175° C., in which peaks due to the presence of palladium and silver cannot be recognized while a single peak due to a Pd—Ag alloy can be observed, as shown in FIG. 2. Due to the production of this alloy, the transparent conductive film of the present invention has high conductivity, while also gaining a high level of durability with respect to saline resistance, acid resistance, oxidation resistance, and ultraviolet resistance.

The thickness of the transparent conductive layer should preferably be within the range of 5–200 nm. In particular, good transparency can be obtained while retaining sufficient static prevention effects and electromagnetic shielding effects by making the thickness within the range of 5–50 nm. At a thickness of less than 5 nm, not only does it become difficult to obtain sufficient electromagnetic shielding effects, but it also becomes difficult to form a uniform film. On the other hand, if the thickness exceeds 200 nm there are no problems in the conductivity, but the transparency is reduced, thereby reducing the visibility of the transmitted images.

The total content of the at least two types of metals in the transparent conductive film should be selected so as to enable the desired electromagnetic shielding effects to be obtained in consideration of the above-mentioned film thickness.

In general, electromagnetic shielding effects can be expressed by the following Equation 1:

$$\text{Equation 1:} \quad S(\text{dB}) = 50 + 10\log\left(\frac{1}{\rho f}\right) + 1.7t\sqrt{\frac{f}{\rho}}$$

(wherein S(dB) represents the electromagnetic shielding effect, ρ (Ω·cm) represents the volume resistivity of the conductive film, f (MHz) represents the electromagnetic frequency, and t (cm) represents the thickness of the conductive film).

In this case, the thickness t is extremely thin as mentioned above, so that the electromagnetic shielding effect S can be approximated by the following Equation 2 by ignoring the term with the thickness t in Equation 1.

$$\text{Equation 2:} \quad S(\text{dB}) = 50 + 10\log\left(\frac{1}{\rho f}\right)$$

That is, a greater shielding effect will be generated with respect to a wide range of frequencies of electromagnetic waves if the volume resistivity (ρ) of the transparent conductive film is made as small as possible. Generally, electromagnetic shielding effects are considered to be effective if S>30 dB and exceptional if S>60 dB. Since the frequency of the electromagnetic waves which are to be controlled is generally in the range of 10 kHz–1000 MHz, the volume resistivity (ρ) of the transparent conductive layer should preferably be less than or equal to $10^3$ Ω·cm in order to obtain good electromagnetic shielding effects with a film thickness of 200 nm or less.

In order to fulfill this condition, the transparent conductive layer should contain metal in an amount of at least 10% by weight. If the metallic content is less than 10% by weight, the conductivity will be reduced so as to make it difficult to obtain substantial electromagnetic shielding effects.

If the transparent conductive layer is colored due to the content of metals other than palladium, the hue can also be adjusted by suppressing the light absorption characteristics of the metal in the transparent conductive film by means of ultraviolet irradiation, infrared irradiation, microwave irradiation, X-ray irradiation, or gamma ray irradiation.

The transparent conductive film of the present invention may also be formed from a single transparent conductive layer or may be formed from a lamination of a plurality of transparent conductive layers of transparent thin films which do not have electrical conduction capabilities.

Next, the low-reflectivity transparent conductive film of the present invention shall be explained.

This low-reflectivity transparent conductive film has at least one layer of a transparent thin film having a refractive index different from the refractive index of the transparent conductive layer above or below the transparent conductive film. This transparent thin film eliminates and reduces the reflection of ambient light from the boundaries of the film by means of an interference effect, and is used to confer an anti-reflective effect to the transparent conductive film. This transparent thin film is not necessarily restricted to a single layer, and may be formed from multiple layers.

Generally, boundary reflection prevention capabilities in multi-layered thin films are determined by the refractive indices and thicknesses of the thin films and the number of laminated thin films. Consequently, effective anti-reflection effects can be conferred to the low-reflectivity transparent conductive film of the present invention as well by appropriately designing the transparent conductive film and the transparent thin films by considering the number of laminated films.

The transparent thin films not only prevent reflection at the boundaries in a multi-layered thin film but also can be expected to have an effect of protecting the screen from external forces when used on a display screen of a display device. Therefore, it is preferable for a transparent thin film having sufficient strength for practical purposes and having a lower refractive index than the transparent conductive film to be provided above the transparent conductive film. As a result, it is possible to obtain a low-reflectivity transparent conductive film which is practical for use in display devices such as cathode ray tubes and plasma displays.

Examples of materials capable of forming the transparent thin film include thermoplastic, heat-hardening, and light/ electron beam hardening resins such as polyester resins, acrylic resins, epoxy resins, and butyral resins; hydrolysates of alkoxides of metals such as silicon, aluminum, titanium, and zirconium; and silicone monomers and silicone oligomers, which may be used either alone or as mixtures.

A particularly favorable transparent thin film is an of $SiO_2$ thin film which has a high surface hardness and a relatively low refractive index. An example of a material capable of forming such an $SiO_2$ thin film is a compound as expressed by the following formula:

$$Si(OR)_m R_n$$

(wherein R represent a $C_1$–$C_4$ alkyl group, m represents an integer of 1–4, n represent an integer of 0–3, and m+n equals 4), partial hydrolysates thereof, or mixtures of one or more types thereof. As an example of such a compound, tetraethoxysilane ($Si(OC_2H_5)_4$) which is suitable for use in view of the ability to form a thin film, the transparency, film strength, and anti-reflective capabilities.

If they allow the transparent thin film to be adjusted to a different refractive index from the transparent conductive film, it is also possible to add various types of resins, metal oxides, composite oxides, or nitrides, or precursors which generate these due to baking.

The formation of the transparent thin film can be performed by any method wherein a coating fluid (transparent-thin-film-forming coating material) containing the above-mentioned components is uniformly coated, as with the method of forming the transparent conductive film. While the coating can be performed by spin coating, roll coating, knife coating, bar coating, spray coating, meniscus coating, dip coating, gravure printing, or the like, spin coating is particularly preferable. After coating, the coating film is dried, and a hard film is formed, preferably by means of baking or light/electron beam irradiation.

The low-reflectivity transparent conductive film of the present invention may have a transparent rough layer, i.e. a transparent film having a roughened profile, as the outermost layer. This transparent rough layer has the effect of scattering light reflected form the surface of the low-reflectivity transparent conductive film so as to confer an anti-glare effect to the display screen. In order to obtain a sufficient anti-glare effect, it is preferable to form a roughened surface such that the gloss value (shininess) is reduced by 10–40%, preferably 20–40%, from the gloss value with a flat surface. If the reduction in the gloss value exceeds 40%, this is often accompanied with the haze value exceeding 3%, in which case the film surface can become whitened so as to reduce the visibility such as the image resolution of the transmitted images.

The shape of the rough surface of the transparent rough layer can be appropriately selected depending on the purpose, such as to reduce the reflection of ambient light and to enable the transmitted image to be clearly perceptible. Examples of typical shapes include shapes wherein multiple hemispherical or conical bumps or notches are regularly or irregularly distributed on the surface, shapes wherein multiple rib-shaped projections and depressions are arranged in a blind-fashion or in waves, and shapes wherein multiple regular or irregular grooves are formed on a flat surface.

With any of the above shapes, the height difference of the irregularities (the difference in height between the tops of the projections and the bottoms of the depressions) should preferably be within the range of 0.01–1 μm on average in order to obtain a reduction of the gloss value in the range of 20–40%. When the height difference is less than 0.01 μm, the resulting surface is a substantially flat surface, and it is not possible to obtain sufficient anti-glare effects. On the other hand, if the height difference exceeds 1 μm, the haze increases so as to reduce the resolution of the transmitted images.

In order to form a transparent rough layer on the upper surface of the transparent conductive film, it is possible to use a method of forming a discrete layer (microparticle layer) by spraying a transparent coating material with an appropriately adjusted viscosity onto the transparent film, then baking. Additionally, it can also be formed by coating the transparent thin film with a uniform thickness of a transparent coating material containing transparent microparticles such as $SiO_2$ microparticles and a medium, then evaporating the solvent so as to form irregularities with the transparent microparticles. Furthermore, it is also possible to form irregularities on a flat transparent conductive film surface by means of embossing or etching.

If the refractive index of the transparent rough layer is set to a refractive index different from that of the transparent conductive layer, then the transparent rough layer will be effective not only in scattering ambient light reflections but also in preventing interlayer reflections. Additionally, the transparent rough layer should preferably be made into a hard coat as with the transparent thin film in view of the film strength and the anti-reflective capabilities. When considering these points, the transparent rough layer should preferably be formed using a coating material identical to that used to form a transparent thin film, such as a tetraethoxysilane coating material, for the purposes of film strength and anti-reflective effects.

At least one layer constituting the low-reflectivity transparent conductive film of the present invention may contain a colorant. This colorant is added for adjusting the hue of the transmitted images by masking so as to provide a natural appearance and for improving the chromatic contrast of the transmitted images, when there are deviations in the spectrum of transmitted light due to the metals contained in the transparent conductive layer. For example, when silver is used as one type of metal, the transparent conductive layer will be given a yellowish color because silver absorbs light in the lower wavelengths of 400–530 nm in the visible range, thus making the hue of the transmitted images appear unnatural. The addition of a colorant has the effect of correcting this to flatten the spectrum of the transmitted light over the entire visible wavelength range, thereby improving the hue of the transmitted images.

Colorants which are appropriate for use in the low-reflectivity transparent conductive film of the present invention are blue, violet, and black colorants. Among these, violet pigments and blue pigments are especially effecting in toning transmitted images, and while black pigments also have a toning effect, they additionally have the effect of increasing the chromatic contrast of the transmitted images.

Examples of colorants which are suitable for use include organic and inorganic pigments such as phthalocyanine blue, cyanine blue, indanthrone blue, dioxazine violet, aniline black, alkali blue, titanium oxide, chrome oxide, iron black, cobalt blue, cerulean blue, zinc chromate, ultramarine blue, manganese violet, cobalt violet, prussian blue, and carbon black; and blue, violet, or black dyes such as azo dyes, anthraquinone dyes, indigoid dyes, phthalocyanine dyes, carbonium dyes, quinoneimine dyes, methine dyes, quinoline dyes, nitro dyes, nitroso dyes, benzoquinone dyes, naphthoquinone dyes, naphthalimide dyes, and perinone dyes.

However, the low-reflectivity transparent conductive film of the present invention may also contain colorants for hues other than for toning purposes, such as for giving the screen a specific color.

Additionally, aside from the conventional colorants mentioned above, it is possible to use other colorants which have been used for proposed for transparent conductive films or the display screens of cathode ray tubes, for example, those which have filter effects of selectively absorbing visible light other than the three primary colors (for example, see Japanese Patent Application, First Publication No. Hei 1-320742, Japanese Patent Application, First Publication No. Hei 3-11532, and Japanese Patent Application, First Publication No. Hei 3-254048), those which obtain high-contrast effects by reducing overall transmissivity of visible light (for example, see Japanese Patent Application, First Publication No. Hei 6-80903), those which obtain anti-reflective effects by using colorants which roughly correspond to the minimum reflectivity in an anti-reflective film due to absorption of light in a lamination (for example, see Japanese Patent Application, First Publication No. Hei 5-203804), and those which obtain natural images which are soft on the eyes by absorbing visible light of specific wavelengths (for example, Japanese Patent Application, First Publication No. Hei 7-151903).

The low-reflectivity transparent conductive film of the present invention can be applied effectively to the display screens of various types of display devices such as cathode ray tubes, plasma displays, liquid crystal displays, touch panels, and electro-optic display devices, the windows of automobiles and buildings, and the view windows of microwave ovens.

The display device of the present invention has the above-mentioned low-reflectivity transparent conductive film formed on the display screen. This display device prevents the accumulation of static electricity on the display screen so that dust does not adhere to the image display screen, shields electromagnetic waves so that various types of electromagnetic disturbances are prevented, has exceptional light transmission so that the images are bright, has a uniform thickness so that the outer appearance of the display screen is improved, has controlled reflection so that the visibility is good, and has high durability with respect to saline resistance, acid resistance, oxidation resistance, and ultraviolet resistance so that conductivity is not lost even in metal-corrosive environments such as in saline water or sunlight.

In particular, the display device of the present invention wherein the transparent conductive film contains palladium is highly resistant to the halogen salts contained in salt components due to seawater and the sweat of operators during transport, hydrogen sulfide gases in hot spring areas, acidic liquids such as $SO_x$ gases and acid rain in the atmosphere, and oxide gases such as ozone which are generated by ultraviolet radiation, and is capable of maintaining the initial performance such as with respect to anti-static effects, electromagnetic shielding effects, anti-reflective effects, hue, and film strength over long periods of time, even when placed under environmental conditions which include such degrading factors.

EXAMPLES

Hereinbelow, the present invention shall be explained in detail by means of examples, but the present invention is not restricted by these examples in any way.

The following were prepared as base fluids common to both the examples and the comparative examples.
(Aqueous Palladium Sol)

An aqueous solution containing 0.15 mmol/l of palladium chloride and an aqueous solution containing 0.024 mmol/l of sodium boron hydride were mixed together, and the resulting colloidial dispersion fluid was concentrated to obtain an aqueous sol containing 0.189 mol/l of palladium microparticles (average grain size 10 nm).
(Aqueous Platinum Sol)

An aqueous solution containing 0.25 mmol/l of chloroplatinic acid hydrate and an aqueous solution containing 0.15 mmol/l of sodium boron hydride were mixed together, and the resulting colloidal dispersion fluid was concentrated to obtain an aqueous sol containing 0.103 mol/l of platinum microparticles (average grain size 10 nm).
(Aqueous Silver Sol)

While holding an aqueous solution (60 g) having sodium citrate dihydrate (14 g) and ferrous sulfate (7.5 g) dissolved therein at 5° C., an aqueous solution (25 g) having silver nitrate (2.5 g) dissolved therein was added to obtain a silver sol having a reddish brown color. After removing impurities from this silver sol by centrifugal separation and rinsing, purified water was added to obtain an aqueous sol containing 0.185 mol/l of silver microparticles (average grain size 10 nm).
(Transparent-Thin-Film-Forming Coating Material)

Tetraethoxysilane (0.8 g), 0.1 N hydrochloric acid (0.8 g) and ethyl alcohol (98.4 g) were mixed together to form a uniform aqueous solution.

Example 1

Preparation of Transparent-Conductive-Film-Forming Coating Material

| | |
|---|---|
| Aqueous Palladium Sol | 15 g |
| Aqueous Silver Sol | 35 g |
| Isopropyl Alcohol | 10 g |
| Ethyl Alcohol | 40 g |

The above-listed components were mixed together, then the resulting fluid mixture was made into a dispersion by an ultrasonic dispersing machine (BRANSON ULTRASONICS "Sonifier 450"), to prepare the transparent-conductive-film-forming coating material of Example 1.
Film Formation:

The above-described transparent-conductive-film-forming coating material was coated onto the display screen of a Braun tube using a spin coater. After drying, the above-described transparent-thin-film-forming coating material was coated onto the coating surface in the same manner using a spin coater, then this Braun tube was put into a dryer and baked for one hour at 150° C. to form a low-reflectivity transparent conductive film, thereby producing a cathode ray tube having a reflection preventing, high-conductivity film according to Example 1.

Example 2

Preparation of Transparent-Conductive-Film-Forming Coating Material

| | |
|---|---|
| Aqueous Palladium Sol | 35 g |
| Aqueous Silver Sol | 15 g |
| Isopropyl Alcohol | 10 g |
| Ethyl Alcohol | 40 g |

The above-listed components were mixed together, then processed in the same manner as with Example 1 to prepare the transparent-conductive-film-forming coating material of Example 2.

Film Formation:

The above-described transparent-conductive-film-forming coating material was used and treated in the same manner as with Example 1 to produce a cathode ray tube having a reflection preventing, high-conductivity film according to Example 2.

Example 3

Preparation of Transparent-Conductive-Film-Forming Coating Material

| Aqueous Palladium Sol | 45 g |
| Aqueous Silver Sol | 5 g |
| Isopropyl Alcohol | 10 g |
| Ethyl Alcohol | 40 g |

The above-listed components were mixed together, then processed in the same manner as with Example 1 to prepare the transparent-conductive-film-forming coating material of Example 3.

Film Formation:

The above-described transparent-conductive-film-forming coating material was used and treated in the same manner as with Example 1 to produce a cathode ray tube having a reflection preventing, high-conductivity film according to Example 3.

Example 4

Preparation of Transparent-Conductive-Film-Forming Coating Material

| Aqueous Palladium Sol | 25 g |
| Aqueous Silver Sol | 25 g |
| Isopropyl Alcohol | 10 g |
| Ethyl Alcohol | 40 g |

The above-listed components were mixed together, then processed in the same manner as with Example 1 to prepare the transparent-conductive-film-forming coating material of Example 4.

Film Formation:

The above-described transparent-conductive-film-forming coating material was used and treated in the same manner as with Example 1 to produce a cathode ray tube having a reflection preventing, high-conductivity film according to Example 4.

Example 5

Preparation of Transparent-Conductive-Film-Forming Coating Material

| Aqueous Palladium Sol | 12.5 g |
| Aqueous Platinum Sol | 12.5 g |
| Aqueous Silver Sol | 25 g |
| Isopropyl Alcohol | 10 g |
| Ethyl Alcohol | 40 g |

The above-listed components were mixed together, then processed in the same manner as with Example 1 to prepare the transparent-conductive-film-forming coating material of Example 5.

Film Formation:

The above-described transparent-conductive-film-forming coating material was used and treated in the same manner as with Example 1 to produce a cathode ray tube having a reflection preventing, high-conductivity film according to Example 5.

Comparative Example 1

Preparation of Transparent-Conductive-Film-Forming Coating Material

| Aqueous Silver Sol | 50 g |
| Isopropyl Alcohol | 10 g |
| Ethyl Alcohol | 40 g |

The above-listed components were mixed together, then processed in the same manner as with Example 1 to prepare the transparent-conductive-film-forming coating material of Comparative Example 1.

Film Formation:

The above-described transparent-conductive-film-forming coating material was used and treated in the same manner as with Example 1 to produce a cathode ray tube having a reflection preventing, high-conductivity film according to Comparative Example 1.

Comparative Example 2

Preparation of Transparent-Conductive-Film-Forming Coating Material

| Antimony-doped Tin Oxide Powder (SUMITOMO OSAKA CEMENT, average grain size 0.01 μm) | 1.5 g |
| Purified Water | 78.5 g |
| Butyl Cellosolve | 10.0 g |
| IPA | 10.0 g |

The above-listed components were mixed together, then made into a dispersion by an ultrasonic dispersing machine (BRANSON ULTRASONICS "Sonifier 450"), to prepare the transparent-conductive-film-forming coating material of Comparative Example 2.

Film Formation:

The above-described transparent-conductive-film-forming coating material was coated onto the display screen of a Braun tube using a spin coater. After drying, the above-described transparent-thin-film-forming coating material was coated onto the coating surface in the same manner using a spin coater, then a low-reflectivity transparent conductive film was formed by baking in a dryer for one hour at 150° C., thereby producing a cathode ray tube having a reflection preventing, high-conductivity film according to Comparative Example 2.

The type and quantities of metals contained in the transparent-conductive-film-forming coating materials according to the above-described Examples 1–5 and Comparative Examples 1 and 2 are shown in Table 1.

TABLE 1

| Coating Material | Types of Metals | Metal Content (parts by wt.) |
|---|---|---|
| Example 1 | Pd | 0.3 |
| | Ag | 0.7 |
| Example 2 | Pd | 0.7 |
| | Ag | 0.3 |
| Example 3 | Pd | 0.9 |
| | Ag | 0.1 |
| Example 4 | Pd | 0.5 |
| | Ag | 0.5 |
| Example 5 | Pd | 0.25 |
| | Pt | 0.25 |
| | Ag | 0.50 |
| Comparative Example 1 | Ag | 1.0 |
| Comparative Example 2 | ATO*[1] | 1.0 |

*[1] antimony-doped tin oxide (Evaluatory Measurements)

The properties of the low-reflectivity transparent conductive films formed on the cathode ray tubes were measured by means of the following devices or methods.

Transmissivity: TOKYO DENSHOKU "Automatic Haze Meter H III DP"
Haze: TOKYO DENSHOKU "Automatic Haze Meter H III DP"
Surface Resistance: MITSUBISHI CHEMICAL CORP. "Rolesta AP" (4-terminal method)
Transmissivity Difference: HITACHI, LTD. "U-3500" automatic-recording spectrophotometer was used to determine the difference between the maximum transmissivity and minimum transmissivity in the visible light range. (The smaller the maximum-minimum transmissivity difference in the visible light range, the flatter the transmissivity, and the clearer the hue of the transmitted images. Particularly when 10% or less, the color of the transmitted images approaches black, and a high degree of clarity is obtained.)
Reflectivity: EG&G GAMMASCIENTIFIC "Model C-11"
Electromagnetic Shielding: Calculated by the above-given Equation 1 at a standard of 0.5 MHz.
Saline Resistance: Electromagnetic shielding at 0.5 MHz after 3 days of immersion in saline.
Interplaner Spacing: The interplaner spacing of the conductive material was measured using an X-ray diffraction device. The X-ray diffraction values indicate the interplaner spacings of the (1,1,1) plane in Examples 1–5 and Comparative Example 1, and of the (1,1,0) plane in Comparative Example 2, with the values in the ( ) indicating the theoretical values.

The measurement results are shown in Tables 2 and 3.

TABLE 2

| | Transmissivity (%) | Haze (%) | Surface Resistance ($\Omega$/square) | Transmissivity Difference (%) |
|---|---|---|---|---|
| Example 1 | 70.1 | 0.0 | $1 \times 10^2$ | 10 |
| Example 2 | 70.1 | 0.0 | $5 \times 10^2$ | 3 |
| Example 3 | 70.3 | 0.0 | $8 \times 10^2$ | 2 |
| Example 4 | 70.5 | 0.0 | $3 \times 10^2$ | 5 |
| Example 5 | 71.2 | 0.0 | $5 \times 10^2$ | 8 |
| Comparative Example 1 | 76.3 | 0.1 | $6 \times 10^2$ | 20 |
| Comparative Example 2 | 102.7 | 0.1 | $5 \times 10^7$ | 1 |

TABLE 3

| | Reflectivity (%) | 0.5 MHz Electro-Magnetic Shielding (dB) | Saline Resistance | Interplaner Spacing (Å) |
|---|---|---|---|---|
| Example 1 | 0.6 | 87.2 | 82.5 | 2.33 (2.33) |
| Example 2 | 0.3 | 80.2 | 80.1 | 2.27 (2.28) |
| Example 3 | 0.5 | 78.2 | 78.2 | 2.25 (2.26) |
| Example 4 | 0.2 | 82.4 | 81.8 | 2.30 (2.30) |
| Example 5 | 0.4 | 80.2 | 79.4 | 2.31 (2.31) |
| Comparative Example 1 | 0.9 | 75.0 | 10.1 | 2.36 (2.36) |
| Comparative Example 2 | 1.0 | 56.0 | 56.0 | 3.36 (3.35) |

The results of Tables 2 and 3 show that the cathode ray tube samples of Examples 1–5 which have low-reflectivity transparent conductive films having transparent conductive layers containing at least two types of metals in a total of at least 10% by weight on the display screens all have favorable transmissivities, small transmissivity differences, low reflectivity, and no substantially detectable haze, so that the transmitted images are bright, have a natural hue, and are sharp. Additionally, the surface resistance is small, so that the anti-static effect is large, and the electromagnetic shielding effects are excellent. Furthermore, the fact that they have exceptional saline resistance indicates that they also have exceptional durability.

The measurement results for the interplaner spacing of the X-ray analysis indicate that the metals in the transparent conductive layers of Examples 1–5 were detected as single-substance peaks, which roughly matched the interplaner spacings (theoretical values) of alloys composed from ratios of Pd:Ag=3:7, Pd:Ag=7:3, Pd:Ag=9:1, Pd:Ag=5:5, and Pd:Pt:Ag=2.5:2.5:5.0, thus demonstrating that these two or three types of metals formed alloys in the transparent conductive layers.

In contrast thereto, the cathode ray tube of Comparative Example 1 having a conventionally known low-reflectivity transparent conductive film has a transparent conductive layer composed of microparticles of a single metal (Ag) and therefore has a high transmissivity difference in the spectrum transmitted visible light, so that there was a deviation in the hue, and the colors of the transmitted images appeared unnatural. Additionally, the reflection was high, and haze was observed, so that the perceptibility was deficient. Furthermore, the saline resistance was extremely low, so that the durability was deficient. On the other hand, the cathode ray tube of Comparative Example 2 had a transparent conductive layer composed of antimony-doped tin oxide, having a high reflectivity and exhibiting haze, so that the perceptibility was deficient. Additionally, the surface resistance was high so that the electromagnetic shielding was deficient, so that the value essentially as a low-reflectivity electromagnetic shielding display device was low in comparison to the cathode ray tube of the present invention.

INDUSTRIAL APPLICABILITY

As described above, the transparent conductive film of the present invention has a transparent conductive layer containing at least two types of metals in a total amount of at least 10% by weight, as a result of which the transparency, tonability and conductivity are high, the static prevention effects and electromagnetic shielding effects are exceptional, and the tone of the transmitted images is controlled. Furthermore, the durability is exceptional with respect to saline resistance, acid resistance, oxidation resistance, ultraviolet resistance, and the like, and the transparent conductive film can be used advantageously for the static prevention and electromagnetic shielding of various types of display devices.

Since the low-reflectivity transparent conductive film of the present invention has the above-mentioned transparent conductive layer as an upper layer and/or a bottom layer, and has at least one layer of a transparent thin film having a refractive index different from the refractive index of the transparent conductive layer, anti-reflection capabilities are conferred in addition to the above-mentioned properties, the static prevention effects and electromagnetic shielding effects are exceptional, the tone of transmitted images is controlled, and the durability is exceptional with respect to saline resistance, acid resistance, oxidation resistance, and ultraviolet resistance, and ambient light reflection and haze are also suppressed so as to result in transmitted images which are clear and have good perceptibility.

The display device of the present invention has the above-mentioned low-reflectivity transparent conductive film formed on the display screen, so that dust will not adhere to the image screen, electromagnetic waves are effectively shielded so as to prevent various electromagnetic disturbances, the light transmission is exceptional so that images are bright, the film thickness is uniform so that the appearance of the display screen is improved, the reflection is suppressed so that the perceptibility is good, and the durability is high such as with respect to saline resistance, acid resistance, oxidation resistance, and ultraviolet resistance so that the conductivity is not lost even in metal-corrosive environments such as in saline and sunlight.

Accordingly, the transparent conductive film and low-reflectivity transparent conductive film of the present invention can be effectively applied to various types of display devices such as cathode ray tubes of televisions and computer displays, plasma displays, liquid crystal display devices, touch panels, and electro-optic display devices, the transparent electrodes of solar batteries, the transparent conductive portions of transparent heating elements, or devices which radiate electromagnetic waves, or can be adhered to glass, building materials, or the like, such as for the windows of surgery rooms, broadcasting studios, OA installations, and automobiles/buildings, or to the view windows of microwave ovens.

Additionally, the display device of the present invention has high durability even under severe conditions, and is capable of maintaining reflection prevention, static prevention, and electromagnetic shielding effects over long periods of time.

What is claimed is:

1. A display device comprising transparent conductive film formed on a display screen, the transparent conductive film having a transparent conductive layer containing metals in an amount of at least 10% by weight, at least two types of the metals being palladium and silver, the weight ratio of palladium:silver being within the range of 30:70 to 99:1.

2. A display device in accordance with claim 1, wherein at least a portion of the metals in said transparent conductive layer are fused to form a continuous metallic thin film.

3. A display device in accordance with claim 1, wherein at least a portion of the at least two types of metals in said transparent conductive layer form an alloy.

4. A display device in accordance with claim 1, wherein at least one transparent thin film is provided above and/or below said transparent conductive film, having a refractive index different from the refractive index of said transparent conductive layer.

5. A display device in accordance with claim 4, wherein said transparent thin film contains $SiO_2$.

6. A display device in accordance with claim 4, wherein a transparent rough layer is formed as an outermost layer of said low-reflectivity transparent conductive film.

7. A display device in accordance with claim 4, wherein at least one layer constituting said low-reflectivity transparent conductive film contains a colorant.

8. A transparent-conductive-film-forming coating material comprising silver particles having an average grain size of 100 nm or less, palladium particles having an average grain size of 100 nm or less, and alcohol in an amount of at least 45% by weight, the weight ratio of palladium:silver being within the range of 30:70 to 99:1.

9. A process for producing a display device, the process comprising applying the transparent-conductive-film-forming coating material according to claim 8 on a display screen and then baking the display screen at a temperature within the range of 150–250° C.

* * * * *